(12) United States Patent
Hosoya

(10) Patent No.: US 6,879,033 B2
(45) Date of Patent: Apr. 12, 2005

(54) SEMICONDUCTOR DEVICE

(75) Inventor: Futoshi Hosoya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/613,903

(22) Filed: Jul. 3, 2003

(65) Prior Publication Data

US 2004/0021216 A1 Feb. 5, 2004

(30) Foreign Application Priority Data

Jul. 8, 2002 (JP) ........................ 2002-198205

(51) Int. Cl.$^7$ .................. H01L 29/74; H01L 23/58; H05K 7/02; H05K 7/10
(52) U.S. Cl. ............. 257/699; 257/708; 257/730; 257/689; 257/731; 257/732; 257/707; 257/688; 257/737; 257/738; 257/107; 257/690; 257/692; 361/760; 361/749; 361/777; 361/776; 174/35 R; 174/51; 174/254
(58) Field of Search ............. 257/699, 708, 257/731, 732, 688, 689, 707, 690, 692, 107; 361/760, 749, 777, 776; 174/35 R, 51, 254

(56) References Cited

U.S. PATENT DOCUMENTS

| | | | |
|---|---|---|---|
| 5,311,402 A | * 5/1994 | Kobayashi et al. | ......... 361/760 |
| 5,371,404 A | * 12/1994 | Juskey et al. | ............... 257/659 |
| 5,699,610 A | * 12/1997 | Shimada et al. | .............. 29/840 |
| 6,133,634 A | 10/2000 | Joshi | |
| 6,205,026 B1 | * 3/2001 | Wong et al. | ................. 361/704 |
| 6,246,583 B1 | * 6/2001 | Cronin et al. | ................ 361/704 |
| 6,392,888 B1 | * 5/2002 | Chen et al. | ................. 361/704 |
| 6,469,907 B1 | * 10/2002 | Faveluke et al. | .......... 361/760 |
| 6,493,249 B2 | * 12/2002 | Shirakawa et al. | ......... 363/147 |
| 6,515,861 B1 | * 2/2003 | Andric et al. | ............... 361/709 |
| 6,519,154 B1 | * 2/2003 | Chiu | ......................... 361/704 |
| 6,774,466 B1 | * 8/2004 | Kajiwara et al. | .......... 257/673 |
| 6,791,184 B2 | * 9/2004 | Deeney et al. | .............. 257/726 |
| 2001/0048116 A1 | 12/2001 | Standing et al. | |
| 2004/0065947 A1 | * 4/2004 | Sugiyama et al. | .......... 257/688 |

* cited by examiner

Primary Examiner—Alexander Oscar Williams
(74) Attorney, Agent, or Firm—Darryl G. Walker; Bradley T. Sako

(57) ABSTRACT

A chip size package semiconductor device can have reliable solder mounting and improved mounting reliability. A semiconductor device (10) of one embodiment can include a semiconductor chip (1) mounted to a bottom portion (11) of a metal base (10). A metal base (10) can have side portions (12) with connection electrodes (15) having a surface level higher than that of electrodes (7 and 8) on a surface of the semiconductor chip (1) by a difference (d). The semiconductor device (10) can be mounted face down without abutting the semiconductor chip (1) against a mounting substrate, thereby preventing mechanical damage to a semiconductor chip (1). At the same time, a solder layer can be formed in the gap between electrodes (7 and 8) and the mounting substrate, thereby raising the reliability of the soldering connection.

7 Claims, 14 Drawing Sheets (a)

(b)

(a)

(b)

SEMICONDUCTOR DEVICE

TECHNICAL FIELD

The present invention relates generally to a semiconductor device packaging, and more particularly to a chip-size package for a semiconductor device.

BACKGROUND OF THE INVENTION

There continues to be a demand for a higher degree of integration for electronic devices that mount semiconductor devices. To meet such goals, there has been a corresponding demand for the reduction in the size of individual semiconductor device packages. One type of semiconductor device package that has been proposed is the "chip size package (CSP)".

FIG. 12 shows a semiconductor device disclosed in U.S. Patent Application Publication 2001/00048116 A1. In this device, a metal plate is provided that is slightly larger than a semiconductor chip 101. The metal plate is processed to have a dish-like shape (e.g., a recessed portion) and the semiconductor chip 101 is mounted in a concave portion 111 of the metal plate (hereinafter referred to as metal base 110).

A semiconductor chip 101 in this example is a metal-oxide-semiconductor (MOS) transistor chip. A drain electrode (not shown) is formed on the rear surface of the semiconductor chip 101 and is fixed directly to the bottom surface of the concave portion 111. The space surrounding the semiconductor chip 101 in the concave portion 111 is filled with a resin 113 for sealing. A gate electrode 107 and a source electrode 108 are formed on the surface of the semiconductor chip 101 to be coplanar with the surface of the metal base 110. Regions within a peripheral portion 112 on the surface of the metal base 110 serve as drain connection electrodes 115.

The semiconductor device is mounted face down onto a mounting substrate (not shown in the drawing) so that drain connection electrodes 115 in peripheral portions 112 of metal base 110 are connected to drain connection electrode pad portion provided on the mounting substrate. At the same time, the gate electrode 107 and source electrode 108 are connected to a gate electrode pad portion and source electrode pad portion (also not shown in the drawing).

The above publication also proposes, as shown in FIG. 13(a), a structure in which a concave portion 121 is formed leaving portions 122 on both sides of a metal base 120. The surfaces of both side portions 122 are used as drain electrodes 125. In addition, as shown in FIG. 13(b), the publication shows a structure in which, instead of both side portions, one side portion 132 of a metal base 130 is left to form a concave portion 131. Grooves 133, as deep as the entire thickness of the metal base 130, are formed in several locations along the length of the one side portion 132. The surfaces of the regions separated by grooves 133 are used as drain electrodes 135.

A technique similar to the one shown in FIG. 13(a) is disclosed in Japanese publication 08-78657 A (the illustration of which is not included herein). In this technique, a concave portion is formed leaving both side portions. A semiconductor chip is mounted in the concave portion. The device is mounted face down, with the surfaces of both side portions being coplanar with electrodes on the surface of the semiconductor chip.

U.S. Pat. No. 6,133,634 discloses a semiconductor device that is almost identical to the semiconductor device shown in FIG. 14. In this semiconductor device, a metal base 140 receives press work, or the like, to form a concave portion 141 and leaving a peripheral portion 142. A semiconductor chip 101 is fixed in the concave portion 141. The surface of the peripheral portion 142 of the metal base 140 is substantially coplanar with electrodes 102 that are formed on the semiconductor chip 101. Solder balls 103 are formed on the surface of the peripheral portion 142 and on the electrodes 102 on the surface of the semiconductor chip 101. This device is mounted face down.

In the above conventional devices, the metal base is slightly larger in surface area than the semiconductor chip, and the total thickness is the sum of the thickness of the semiconductor device and the thickness of the metal base (at the bottom of a concave portion). Furthermore, there is no need to bond a metal wire, or the like, to the semiconductor device, and resin is not necessary for sealing the package. This makes it possible to reduce the size and thickness of a semiconductor device chip holding package. Further, such a relatively simple structure can be easy to manufacture. Another advantage can be heat dissipation. When such structures are mounted, the metal base can function as a heat sink, thereby dissipating heat.

However, inspections by the inventors of the present invention are believed to show latent problems inherent in the above structures. In a device in which a concave portion is formed that leaves a peripheral portion of a metal base, such as that of FIGS. 12 and 14, such a concave portion is obtained through press work or etching of the metal base. Finishing a device with such a relatively complicated process can make it difficult to form a desired shape with a high degree of precision. Thus, such metal base forming techniques present an obstacle to cost reduction. The semiconductor devices shown in FIGS. 13(a) and 13(b) are superior in this regard (i.e., size and/or cost reduction), because both side portions (or one side portion) can be formed by bending or cutting. Thus, achieving higher processing precision can be relatively easy. Additionally, such approaches can have improved heat dissipation capabilities and improved mechanical strength, despite being smaller and/or thinner.

However, in a semiconductor device like that of FIG. 13(a), a drain connection electrode 125 has a larger area than the gate electrode 107 and source electrode 108, because the side portions 122 of metal base 120 have flat surfaces and the entirety of the flat surfaces are used to form the drain connection electrode 125. This means that when the device is mounted face down, the heat capacity of the drain connection electrode 125 is larger than that of the gate electrode 107 and source electrode 108. Therefore, it can be necessary to supply a larger amount of solder to drain connection electrodes 125 than the solder amount for gate electrode 107 and source electrode 108 when mounting the device to a mounting substrate with solder. As a result, the solder density on the mounting substrate can be uneven. Further, heat capacitance of the solder is irregular.

Accordingly, higher temperatures at the drain electrodes 125 can be necessary during a solder reflow step, and such a higher temperature can bring thermal damage to a part of the semiconductor device. In particular, damage may occur at a portion where the semiconductor chip is connected to the metal base. Further, such higher temperatures can reduce the reliability of a connection to gate electrode 107 and source electrode 108 when the solder amount is low. This can ultimately lower the reliability of the mounting.

Another drawback to an approach like that of FIG. 13(a) can be the substantially coplanar arrangement of the drain connection electrodes 125 with the surfaces of the gate electrode 107 and the source electrode 108. When the semiconductor device is mounted face down onto the mounting substrate, the gate electrode 107 and source electrode 108 can collide against the surface of the mounting substrate, and cause mechanical damage to such electrodes and/or to other parts of the semiconductor chip 101.

It is noted that the semiconductor devices like those shown in FIGS. 12 and 14 can be subject to the same above drawbacks, as the drain connection electrodes for such structures like that of FIG. 13(*a*).

Similarly, the semiconductor device shown in FIG. 13(*b*) includes a drain connection electrode 135 having a larger area than a gate electrode or source electrode. The device thus suffers from similar problems, including varying solder amounts, arising from variances in heat capacity, accompanying thermal damage, and lowered reliability in a solder connection.

If drain connection electrodes 135 are reduced in area, heat capacity of the individual drain connection electrodes during a mounting process can be reduced, and can address the above drawbacks. However, drain connection electrodes 135 are in regions separated by grooves 133 as deep as the entire metal base 130. Thus, in order to separate drain connection electrodes 135, each of the drain connection electrodes 135 would be cantilevered with respect to the metal base 130. This can lower the mechanical strength of the drain connection electrodes 135 and weakens the metal base supporting strength when the device is mounted on the mounting substrate. Thus, such a modification can present another factor to lower the mounting reliability.

Still further, like the device of FIG. 13(*a*), in the device of FIG. 13(*b*) drain connection electrodes 135 can have a surface essentially level with that of the gate electrode 107 and source electrode 108. Thus, an approach like that of FIG. 13(*b*) can also suffer from mechanical damage when mounting takes place.

In light of the above, it would be desirable to arrive at a semiconductor device having an improved mounting reliability with respect to conventional approaches. In particular, it would be desirable to arrive at such a result by improving soldering upon mounting such a device.

SUMMARY OF THE INVENTION

The present invention can include a semiconductor device having a metal base with a bottom portion formed from a metal plate and at least one connection electrode that extends upward from at least a part of the bottom portion to a first surface level. The at least one connection electrode is for mounting the semiconductor device to a mounting surface. The semiconductor device also includes a semiconductor chip mounted to the bottom portion of the metal base having a surface with surface electrodes at a second surface level. The first surface level is higher than the second surface level by a predetermined amount. The surface electrodes are also for mounting the semiconductor device to the mounting surface.

According to one aspect of the embodiments, the predetermined amount can be greater than 0 millimeters and less than or equal to 0.1 mm.

According to another aspect of the embodiments, a semiconductor device can also include solder balls formed on at least one of the connection electrodes and one of the surface electrodes.

According to another aspect of the embodiments, a semiconductor chip can be an insulated gate field effect transistor (IGFET) having a drain electrode formed on a rear surface in direct electrical contact with the bottom portion of the metal base. Thus, the at least one connection electrode can be a drain connection electrode. The surface electrodes can include a gate electrode and source electrode for the IGFET.

The present invention can also include a semiconductor device with a metal base having a bottom portion formed from a metal plate and at least two side portions situated upward from the bottom portion. The at least two side portions can have notches therein to form upper and lower edges in the side portions. The upper edges can be connection electrodes for mounting the semiconductor device to a mounting surface. The semiconductor device can also include a semiconductor chip mounted to the bottom portion of the metal base having a surface with surface electrodes for mounting the semiconductor device to the mounting surface.

According to one aspect of the embodiments, each of the connection electrodes can have an area that is less than any of the surface electrodes.

According to another aspect of the embodiments, connection electrodes can be symmetrical about a first axis that is parallel to the side portions, and symmetrical about a second axis that is perpendicular to the first axis.

According to another aspect of the embodiments, a metal base can include grooves along a border between the bottom portion and each side portion.

According to another aspect of the embodiments, upper edges of side portions can be bent outward, away from remaining portions of the corresponding side portion.

The present invention can also include semiconductor device with a metal base having a bottom portion formed from a metal plate and at least one connection electrode for mounting the semiconductor device to a mounting surface. The at least one connection electrode can extend upward from the bottom portion and can be formed from portions of the metal plate that are thicker than remaining portions. The semiconductor device can also include a semiconductor chip mounted to the bottom portion of the metal base having a surface with surface electrodes for mounting the semiconductor device to the mounting surface. The area of the connection electrode can be greater than the area of any of the surface electrodes.

According to one aspect of the embodiments, the connection electrode can be trapezoidal in cross section, with an upper part having a smaller area than a lower part, the upper part being further from the metal base than the lower part.

According to another aspect of the embodiments, the connection electrodes includes a plurality of connection electrodes that are symmetrical about a first axis that is parallel to the side portions, and symmetrical about a second axis that is perpendicular to the first axis.

According to another aspect of the embodiments, the connection electrodes include at least two connection electrodes formed at opposing sides of the metal base with the semiconductor chip sandwiched between the at least two connection electrodes.

According to another aspect of the embodiments, a semiconductor chip can be mounted in a region close to one side of the metal plate and all of the connection electrodes can be formed in a region close to an opposite side of the metal plate.

According to another aspect of the embodiments, at least one connection electrode can include at least two connection electrodes formed in an inner region of the bottom portion, and positions of the at least two connection electrodes and positions of the surface electrodes are symmetrical about two axes that are perpendicular to one another.

According to another aspect of the embodiments, solder balls can be formed on the at least one of the connection electrodes and one of the surface electrodes.

According to the present invention, a semiconductor device can have the same essential advantages of conventional approaches like that of FIGS. 13(a) and 13(b), which include excellent heat dissipating capability, reduced size, low cost, and enhanced mechanical strength. However, the present invention can also protect electrodes of a semiconductor chip from excessive impact or force when the semiconductor device is mounted face down on a mounting substrate, as connection electrodes can be at a higher level than surface electrodes of the semiconductor chip. Thus, mechanical damage to the semiconductor device can be avoided.

Moreover, according to the present invention, a gap can be provided between surface electrodes of a semiconductor chip and corresponding pad portions of a mounting substrate. As a result, the squashing of solder supplied thereto can be prevented. This can stop solder from leaking out to peripheral portions of a semiconductor device and causing a short circuit with an adjacent pad portion, or cause other inconveniences. Further, with such a gap, the amount of solder between surface electrodes of a semiconductor chip and corresponding pad portions of a mounting substrate can be of the appropriate thickness, therefore connection reliability with respect to mechanical stress can be improved. This can improve soldering reliability.

As noted above, according to a semiconductor device of the present invention, connection electrodes can be formed by selectively cutting of upper edges of both side portions on a metal base. The side portions can then be bent to stand upward from a bottom portion of the metal base. This can make it possible to make connection electrodes with a smaller area than electrodes of semiconductor chip by shortening the length of the connection electrodes. Further, heat capacity for the connection electrodes can be reduced, while mechanical strength can be essentially maintained, as connection electrodes can be continuous with side portions. Reliability in soldering to a mounting substrate can be improved. In particular, a more suitable soldering connection to the connection electrodes and electrodes of the semiconductor chip can be made, even when pad portions of a mounting substrate for such electrodes are the same size.

In the present invention, connection electrodes can be arranged to be symmetrical in a longitudinal direction with respect to the side portions, or in a direction perpendicular with the longitudinal direction, or in both such directions. In such an arrangement, a semiconductor device can be placed on a mounting substrate in stable fashion when soldered thereto. As a result, heat can be more uniformly conducted during a solder operation, and butting force can be more evenly distributed among the connection electrodes. This can improve connection reliability.

In the present invention, grooves can be formed in a surface of a metal plate between a bottom portion and side portions. Such an arrangement can make it possible to form side portions with a relatively high degree of precision.

Further, because connection electrodes can be formed by bending upper edges of side portions outward, an area for soldering connection electrodes to a mounting substrate can be large, even though a metal base is formed from a metal plate. This can make low resistance connections possible.

In the present invention, a semiconductor device can include a metal base with connection electrodes formed by an increased thickness in selected regions of a metal plate. Such connection electrodes can have a smaller area than surface electrodes of a semiconductor chip. Such an arrangement can increase soldering reliability, as the heat capacity of the connection electrodes can be reduced. This can make the solder amount for the connection electrodes substantially equal to the solder amount for the surface electrodes of a semiconductor chip in a mounting operation.

Connection electrodes can be trapezoidal in cross section, with an upper part thereof having a smaller area than a lower part thereof. This can enhance the mechanical strength of the connection electrode and improve the reliability in soldering of the mounting substrate.

DETAILED DESCRIPTION OF THE EMBODIMENTS

Figure 1:
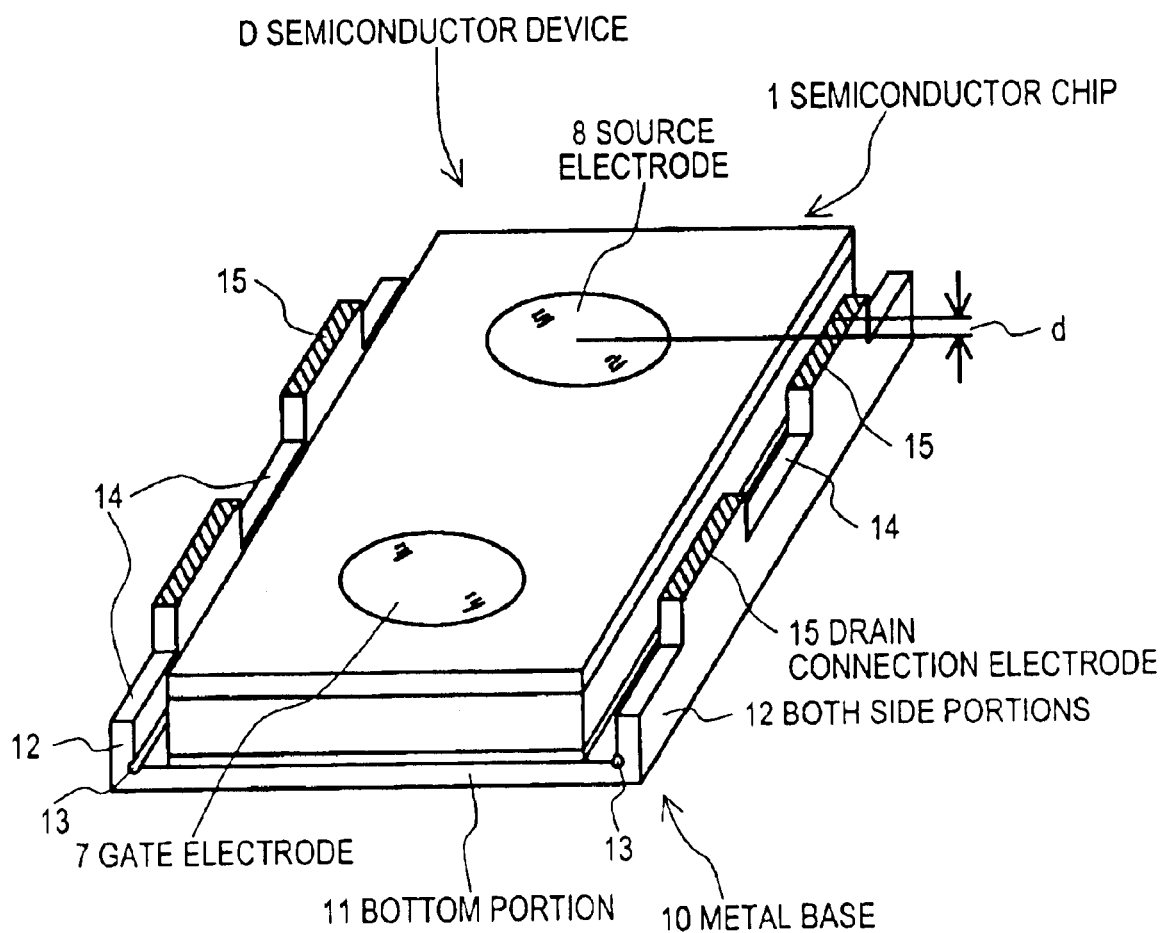
FIG. 1 is a perspective view of a semiconductor device according to a first embodiment of the present invention.

The present invention will be described with reference to a number of drawings. FIG. 1 is a perspective view of a first embodiment in which the present invention is applied to a semiconductor device D with a metal-oxide-semiconductor field effect transistors (MOSFET) chip. As is well known in the art, a MOSFET can be one type of insulated gate field effect transistor.

Figure 2:
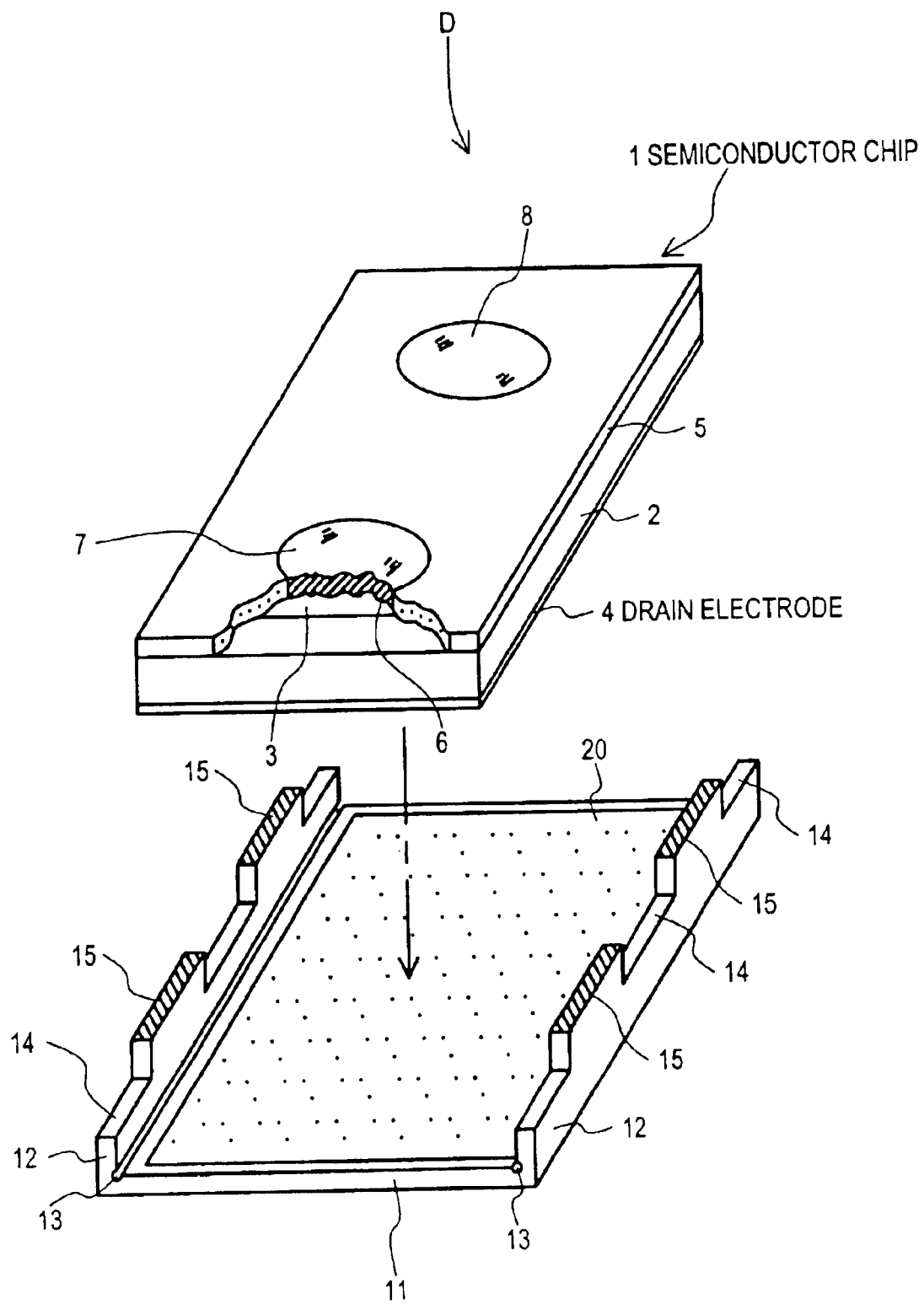
FIG. 2 is an exploded perspective view of a semiconductor device according to a first embodiment.
Figure 3:
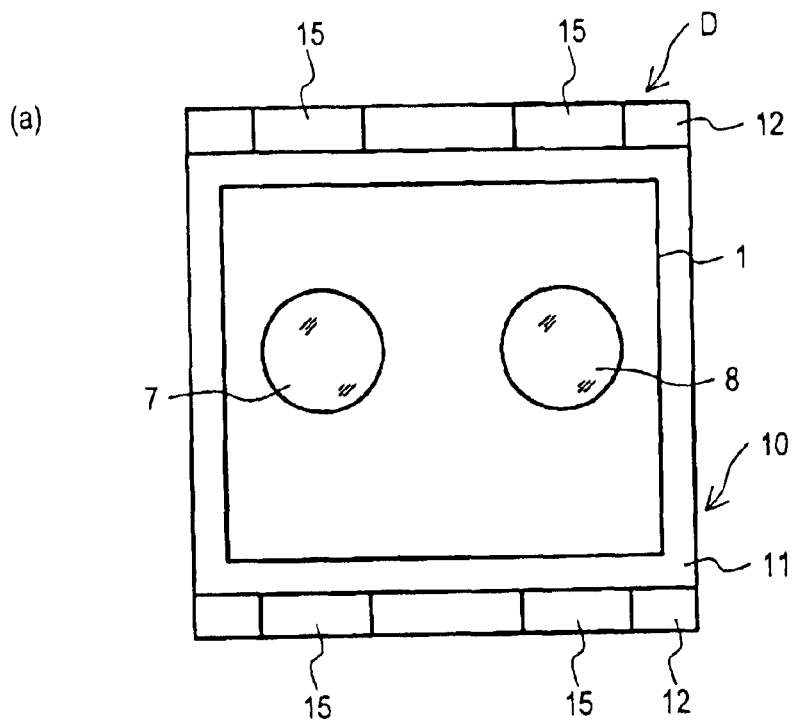
FIGS. 3(a), 3(b) and 3(c) are a plan view, front view, and right side view, respectively, of the semiconductor device of FIG. 1.
Figure 3:
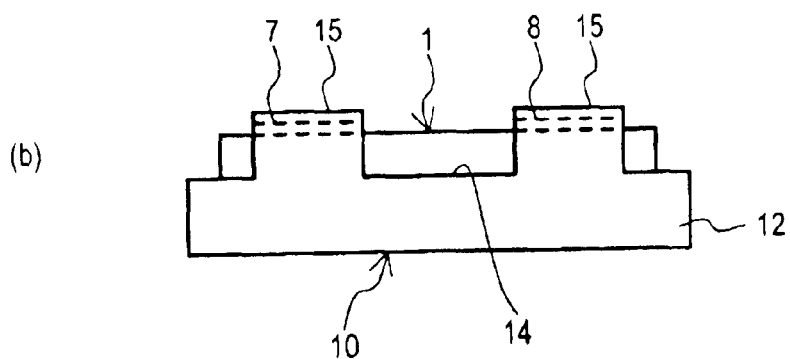
Figure 3:
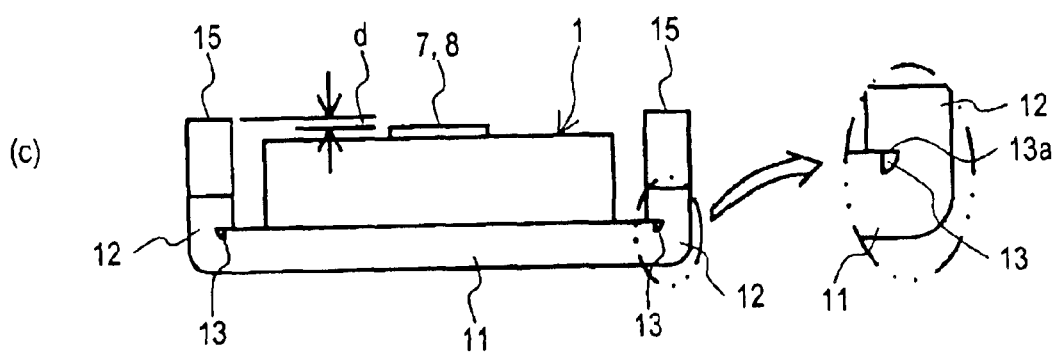

FIG. 2 is a partially exploded perspective view of the device of FIG. 1. FIGS. 3(a), 3(b) and 3(c) are a plan view, front view, and right side view, respectively, of the device of FIG. 1.

Referring now to FIGS. 1, 2 and 3(a) to 3(c), a first embodiment may include a metal base 10 formed from a copper, German silver (e.g., an alloy of copper, zinc, nickel), or other metal plate having a substantially rectangular shape. Both sides of such a plate can be bent to a 90° angle to have a predetermined width. Such a shaping can result in a metal base 10 having a flat bottom portion 11 and side portions 12 standing upright to the left and right of the bottom portion 11.

A metal base 10 can also include shallow and narrow grooves 13 formed on the surface of the metal base 10 that run along the border between the bottom portion 11 and side portions 12. Such narrow grooves 13 make it possible to bend both side portions 12 with a high degree of precision.

In addition, side portions 12 can have notches 14 at intervals along their lengths. Notches 14 can be obtained by cutting a center portion and both ends from each of the side portions 12. A depth of such notches can be essentially half the overall height of the side portions 12. Two parts of each side portion 12, situated between notches 14 where side portions 12 maintain a full height, can be considered convex portions (e.g., 15).

Convex portions (e.g., 15) can serve as drain connection electrodes 15. Each of drain connection electrodes 15, when measured in a longitudinal direction, can have a length less than or equal to a diameter of a circular gate electrode 7 and source electrode 8. A gate electrode 7 and source electrode 8 will be described at a later point herein. In other words, the length of each drain connection electrode 15 can be each equal to, or somewhat shorter than that of gate electrode 7 and source electrode 8.

A semiconductor chip 1 can be mounted on the top face of the bottom portion 11 with a die bonding material 20, such as a silver paste. A semiconductor chip 1, as shown in a partial cutaway view in FIG. 2, can include a MOSFET element 3 formed on the principal surface of the chip 2 that can be cut out of silicon or another semiconductor material (typically in wafer form). A metal layer can be formed all over the rear surface of the underside of the chip 2 and can serve as a drain electrode 4. Also, an insulating layer 5 covering the element 3 can be formed on the top face of the chip 2.

Contact holes 6 can be opened in the insulating layer 5, and metal layers connected to element 3 can be formed in contact holes 6 to form a gate electrode 7 in one contact hole, and a source electrode 8 in another. A gate electrode 7 and source electrode 8 can be formed to have a circular shape and can be placed side by side in a longitudinal direction of both side portions 12. In the particular example shown, a gate electrode 7 and source electrode 8 can have the same shape and same area.

A semiconductor chip 1 can be mounted with a drain electrode 4 on a rear surface in direct contact with a top face of a bottom portion 11 of a metal base 10. With a semiconductor chip 1 thus mounted, positions of gate electrode 7 and source electrode 8 can match the positions of drain connection electrodes 15 formed in both side portions 12, with respect to a longitudinal direction.

Furthermore, as shown in FIG. 1 and FIG. 3(c), when the semiconductor chip 1 is mounted to a metal base 10, there can be a difference in level between gate electrode 7 and source electrode 8 with respect to drain connection electrodes 15. Such a level difference "d" can be obtained in the example of FIG. 3(c) by subtracting a surface level of gate electrode 7 and source electrode 8 from a surface level of drain connection electrodes 15. Such a level difference "d" can be from 0 to 0.1 millimeters (mm), preferably equal to or less than 0.05 mm. As but one example, a level difference "d" can be about 0.03 mm.

Figure 4:
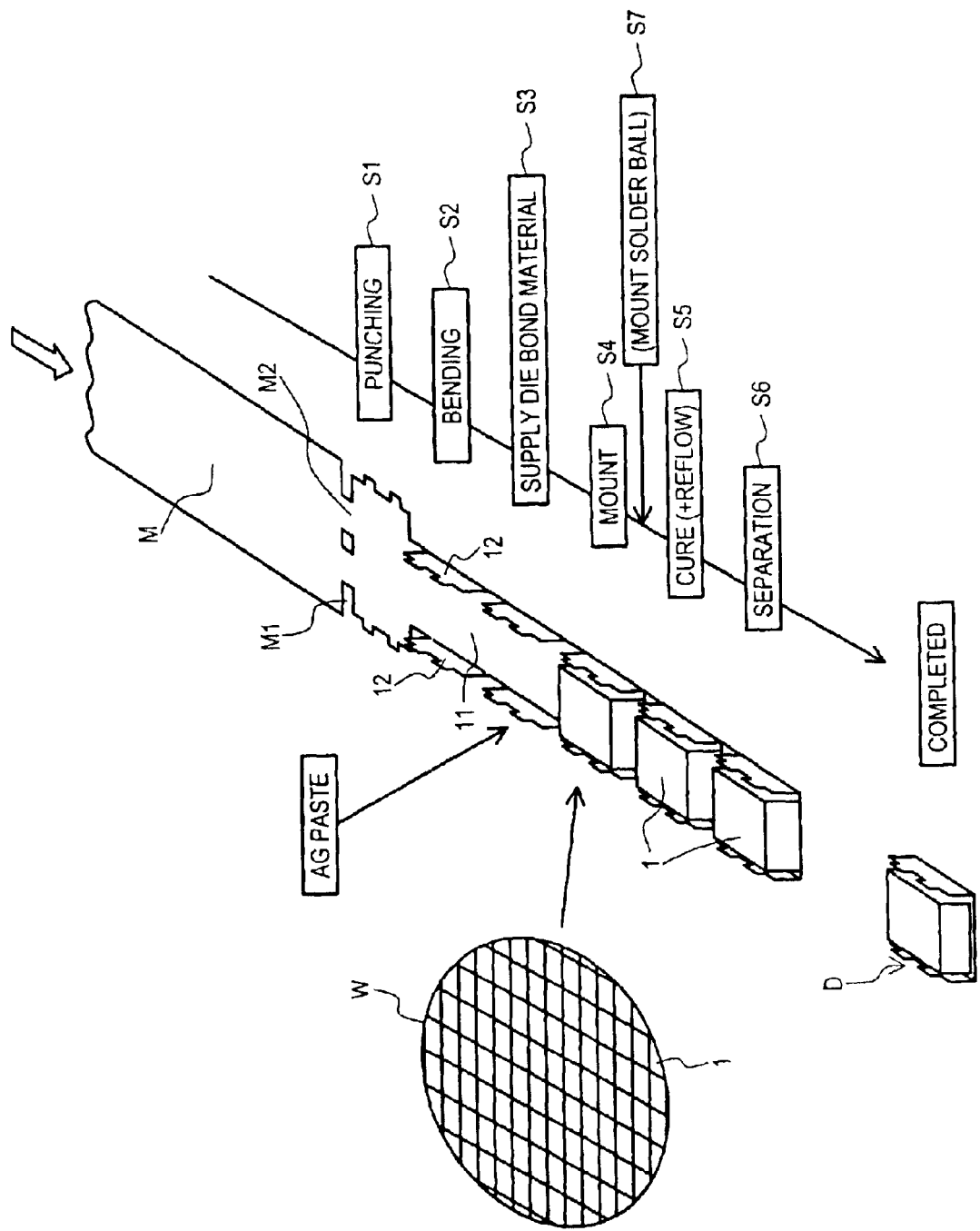
FIG. 4 is a conceptual diagram for illustrating a method of manufacturing semiconductor device according to various embodiments of the present invention.

Having described a semiconductor device D, a method of manufacturing such a device will now be described with reference to FIG. 4. FIG. 4 is a conceptual diagram for illustrating the manufacturing method.

Referring to FIG. 4, an elongated metal plate M of a predetermined thickness can be formed. Such a metal plate M can be formed from copper, German silver, or another suitable metal.

In a step S1, an elongated metal plate M can be fed in the longitudinal direction, and successively punched with a punching machine to form notches M1 along the length of a metal base. Metal bases are thus linked to one another in the longitudinal direction by linking pieces M2. Linking pieces M2 can be can be cut off in a later step to facilitate separation of one individual semiconductor device from another.

At this point, shallow and narrow grooves (e.g., item 13 of FIGS. 1, 2, 3(c)) can be formed on the surface of metal plate M at a border between a bottom portion 10 and both side portions 12 of metal base 10.

Such a punching step S1 can punch out portions of a center and both ends of side portions 12 of the metal base 10 in a longitudinal direction. This can form notches 14 having a predetermined length and a width that is essentially half the total width of the side portions 12.

In a step S2, a bending machine can bend portions of metal plate M outside narrow grooves 13, so that such portions stand at essentially 90°, with respect to a bottom portion 11. Such a step S2 can result in a bottom portion 11 between narrow grooves 13, with side portions 12 standing up to the left and right of the bottom portion 11. The bending of both side portions 12 can be guided by narrow grooves 13, thereby facilitating the bending process for such side portions, and providing for accurate dimensions.

As can be seen by the enlarged view of FIG. 3(c), bending of side portions 12 can be accomplished without forming a curved face (R) on the inner walls of bent portions. Therefore, a bending position can be placed closer to a semiconductor chip 1 that is to be mounted on a metal base 10. This can result in a semiconductor device D that is smaller in size. Further, as also shown in the enlarged view of FIG. 3(c), if both side portions 12 are bent so that side walls 13a of narrow grooves 13 abut a top face of bottom portion 11, position control for side portions can be maintained, and a resulting height for both side portions 12 can be established with a high degree of precision.

Still further, a bending arrangement like that detailed in the enlarged view of FIG. 3(c) can prevent deformation of drain connection electrodes 15 and side portions 12 when mechanical stress is applied to side portions 12 in a subsequent mounting step. In such a mounting step, two portions on the upper surface of each side portion 12, situated between notches 14 (formed by a punching machine), can serve as drain connection electrodes 15. At the same time, side portions 12 can maintain a full width.

In a step S3, a die bond material supplier can place a silver paste, or some other die bond material, onto the surface of the bottom portion 11.

In a step S4, a mounting machine can position a semiconductor chip 1 on a surface of bottom portion 11. A semiconductor chip 1 can be cut from a wafer W. When a semiconductor chip 1 is positioned on a bottom portion 11, a drain electrode 4 on a rear surface of semiconductor chip 1 can be pressed against bottom portion 11. A semiconductor chip 1 can be positioned in a mounting step such that a gate electrode 7 and source electrode 8 are centered with respect to bottom portion. Further, in a longitudinal direction, a gate electrode 7 and source electrode 8 can be aligned with drain connection electrodes 15 on each side portion 12.

In a step S5, a curing machine can subject the structure to a heat treatment to cure (i.e., reflow) a die bond material 20, and thereby mount semiconductor chip 1 to a bottom portion 11. At this point, a force with which semiconductor chip 1 is depressed can be adjusted (or the amount of die bond material 20 can be adjusted) to set a surface level of drain connection electrodes 15 of both side portions 12 to be higher than a surface level of a gate electrode 7 and source electrode 8. Such a surface level difference "d" can be about 0 to 0.1 mm. In the present example, "d" can be about 0.03 mm.

In a step S6, a separating machine can cut links M2 of metal plate M which connect one metal base 10 to another in a longitudinal direction.

Following a step S6 manufacture of an individual semiconductor device D, shown in FIG. 1, can be completed.

Figure 5:
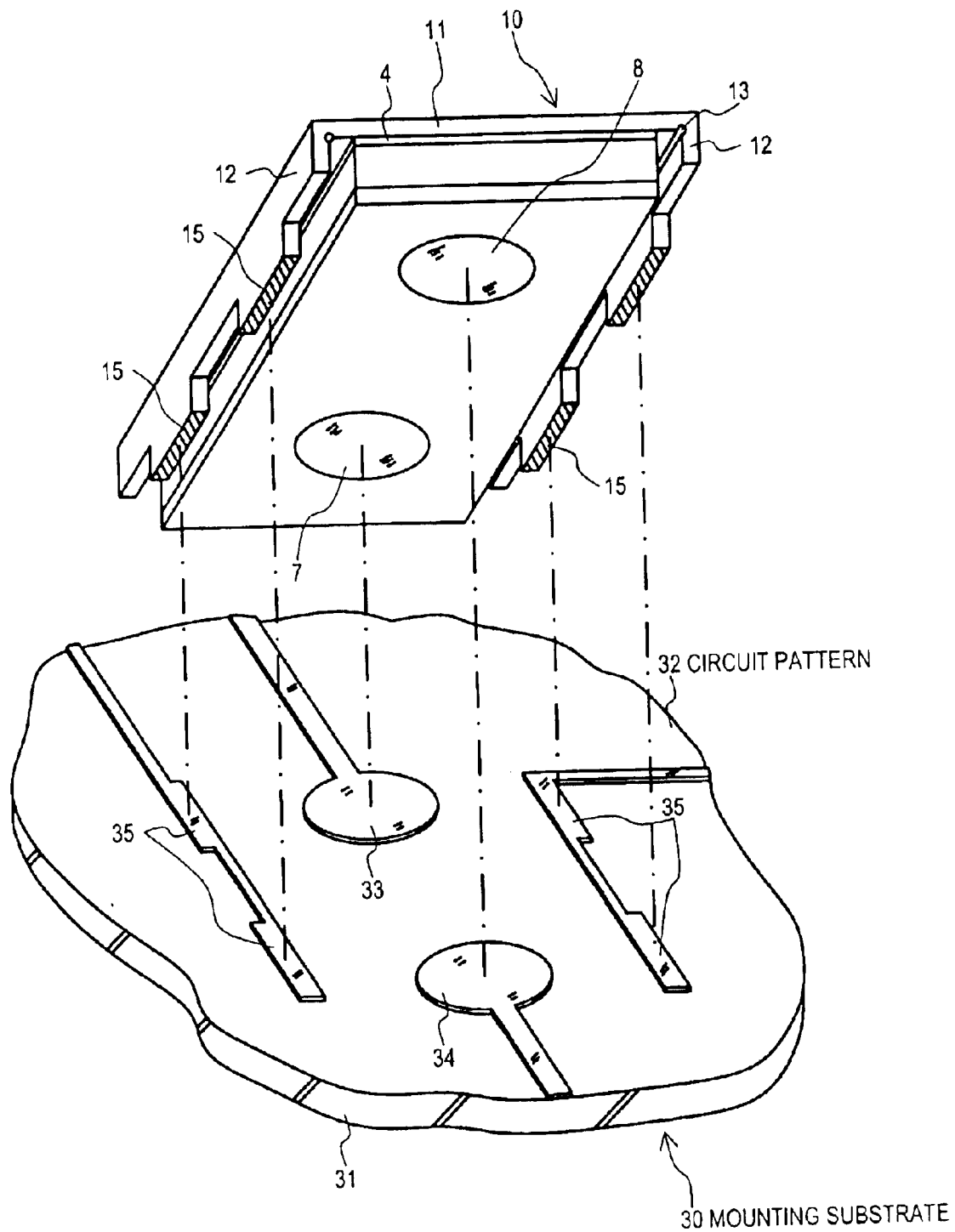
FIG. 5 is a perspective view illustrating a mounting structure for a semiconductor device according to one embodiment of the present invention.

Referring now to FIG. 5, a mounting arrangement for a semiconductor device D is shown in a perspective view. A semiconductor device D can be mounted face down onto a mounting substrate 30 on which a circuit pattern 32 is formed. A circuit pattern 32 can have pad portions corresponding to the positions of the gate electrode 7, source electrode 8, and drain connection electrodes 15. A mounting substrate 30 can be an insulating plate 31 with a copper foil, or the like, patterned to form circuit pattern 32. In the example of FIG. 5, circuit pattern 32 includes a gate pad portion 33, a source pad portion 34, and drain pad portions 35.

When mounting a semiconductor device D to a mounting substrate 30, solder (not shown) can be printed, in advance, onto the surface of pad portions 33, 34 and 35 on mounting substrate 30. Semiconductor device D can then be positioned so that its top face opposes the surface of the mounting substrate, with gate electrode 7, source electrode 8 and drain connection electrodes 15 facing corresponding pad portions 33, 34 and 35, respectively. At this point, solder reflow can be carried out to solder the electrodes of the semiconductor device D to their respective pads. In this way, mounting can be completed.

As described above, in a semiconductor device D of this embodiment, a metal base 10 can have a surface area that is slightly larger than a semiconductor chip 1, and a thickness of the device can be approximately the sum of the thickness of the semiconductor chip 1, and the thickness of metal base 10. Moreover, in such an arrangement there can be no need to bond a metal wire, or the like, to the semiconductor chip 1 and the device is not sealed in resin. Thus, the present invention can provide a semiconductor device having a reduced size and thickness. Further, such a device can also include favorable heat dissipating capabilities as metal base 10 can function as a heat sink.

When mounting a semiconductor device D of the above embodiments to a mounting substrate 30, a surface level of drain connection electrodes 15 can be set higher than a level of gate electrode 7 and source electrode 8 of semiconductor chip 1. Therefore, as a semiconductor device D is put face down on a mounting substrate 30, a drain connection electrode 15 alone can abut the mounting substrate 30. This can save a gate electrode 7 and source electrode 8 from excessive impact, or abutting force, and thus prevent mechanical damage to a semiconductor chip 1.

In addition, in the above arrangement, an appropriate distance can be created between a gate electrode 7 and a source electrode 8 and corresponding pad portion 33 and 34, respectively, so as to not squash solder supplied to these portions. Squashing solder can result in solder leaking out to peripheral portions to thereby short circuit a pad portion 33 or 34 with an adjacent pad portion 35, or cause some other inconveniences. In addition, such a separation distance can ensure that the connecting solder has a sufficient thickness to improve connection reliability against mechanical stress. Soldering reliability can thus be improved.

In the above arrangements, a length of a drain connection electrode 15 on both side portions 12 can be substantially shorter than the total length of a metal base 10, while at the same time being essentially equal in length to a gate electrode 7 and source electrode 8. Accordingly, an area of drain connection electrodes 15 can be smaller than the area of a gate electrode 7 and a source electrode 8. This can result in drain connection electrodes 15 with a lower heat capacity than conventional arrangements. Consequently, when such a device is soldered in a mounting operation, the amount of solder for drain connection electrodes 15 can be almost the same as the amount of solder for a gate electrode 7 and a source electrode 8 of a semiconductor chip 1.

Because drain connection electrodes 15 have a lower heat capacity, the temperature needed to solder such electrodes can be less than conventional arrangements, and thermal damage to a semiconductor chip 1 can be reduced. Further, a lower soldering temperature can prevent solder from running up drain connection electrodes 15, a gate electrode 7 and a source electrode 8, that might otherwise occur. This can produce a more suitable soldering arrangement.

As noted above, the amount of solder needed for drain connection electrodes 15, a gate electrode 7 and a source electrode 8, can be essentially even. Making the amount of solder essentially even in this fashion can facilitate the design of a solder supplying mask of a mounting substrate 30 and/or inspection of a solder paste print result, or the like.

Further, by providing more uniform heat capacity, mounting operations can be more effective as the timing for the melting and/or solidifying solder can be more uniform, thus preventing positioning failures that could otherwise occur.

It is noted that while the area of the drain connection electrodes 15 can be reduced, as their overall length is shortened with respect to conventional approaches, such drain electrodes 15 are arranged side to side on the longitudinal direction, and remain integral to their respective side portions 12. Therefore, the mechanical strength of drain connection electrodes 15 is not believed to be impaired.

In the above embodiments, drain connection electrodes 15 can be symmetrical in a longitudinal direction of both side portions 12. Drain connection electrodes 15 are also symmetrical on a width direction of the semiconductor chip 1 that is perpendicular the longitudinal direction. Accordingly, when a metal base 10 is placed face down on a surface of a mounting substrate 30 during a mounting operation, the evenly arranged drain connection electrodes 15 can abut a mounting surface 30. This can make it possible to stably place the semiconductor device D on a mounting substrate 30 for soldering. As a result, heat can be uniformly conducted during soldering, and an abutting force on a semiconductor device D can be evenly distributed among the drain connection electrodes 15. This can improve connection reliability. That is, in one particular embodiment, four drain connection electrodes 15 are provided that are symmetrical in both a longitudinal direction and width direction of a metal base 10, to thereby provide a highly stable device.

In the manufacture of semiconductor device D of this embodiments, as shown in FIG. 4, both side portions 12 can be formed by bending along narrow grooves 13 formed in metal plate M. Drain connection electrodes 15 can be formed in both side portions by punching. As mentioned before, such an approach can make is possible to improve the reliability of the semiconductor device D over conventional approaches by giving drain connection electrodes 15 highly precise dimensions, and the like. Furthermore, the only processing that may be needed includes punching, bending and press cutting of a metal plate M. As a result, manufacturing can be relatively simple and advantageously lower in price than other conventional approaches.

Figure 6:
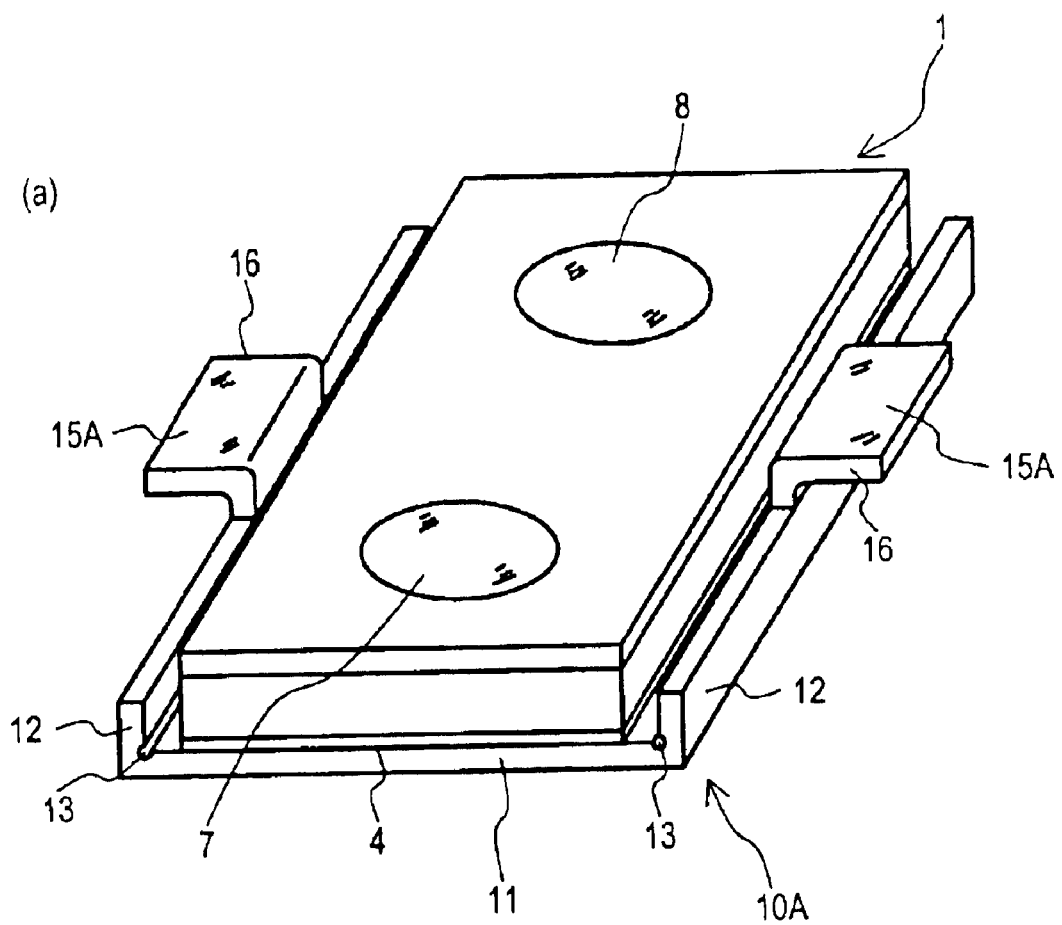
FIGS. 6(a) and 6(b) are a perspective and enlarged side cross sectional views, respectively, of a semiconductor device according to a second embodiment of the present invention.
Figure 6:
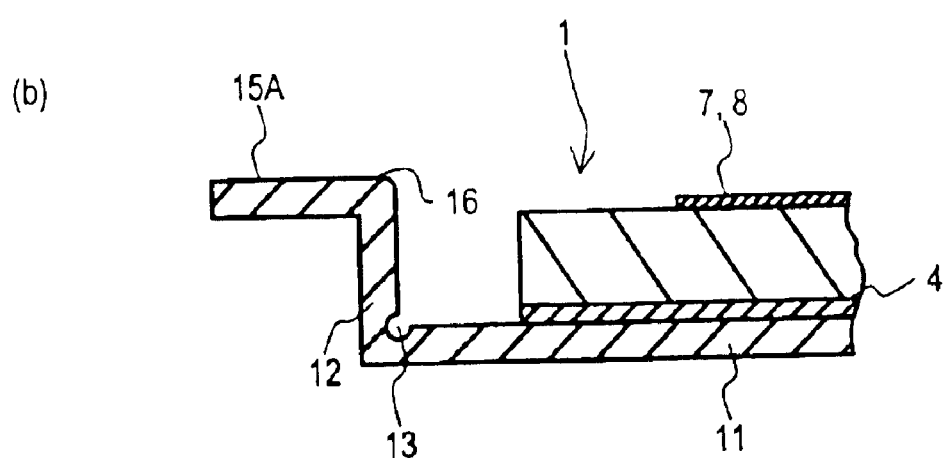

FIG. 6(a) is a perspective view of a semiconductor device according to a second embodiment. FIG. 6(b) is an enlarged partial cross section of the semiconductor device of FIG. 6(a). The example of FIGS. 6(a) and 6(b) shows a semiconductor device that can include a MOSFET, similar to a first embodiment. Components of this embodiment that are equivalent to those of the first embodiment will be denoted by the same reference character.

In this embodiment, the shape of a drain connection electrode of a metal base 10A can be modified to provide one drain connection electrode 15A on each side portion 12. Each drain connection electrode 15A can be formed substantially in the center, in the longitudinal direction, of the corresponding side portion 12. That is, drain connection electrodes 15A can be formed by making a substantially central portion (in the longitudinal direction) of each side portion 12 taller than a remaining portion of the side portion 12. This can form a projecting piece 16. The projecting piece can then be bent outward at a predetermined point at a 90° angle, so that the projecting piece is essentially horizontal. The horizontally-bent portion of the projecting piece 16 can serve as a drain connection electrode 15A.

In the example of FIG. 6(a), the horizontal portion of the projecting piece 16 that serves as a drain connection electrode 15A can have a square shape. A length of a side of such a square can be close to that of a square that would be inscribed within a circle of circular gate electrode 7 and source electrode 8 of the semiconductor chip 1.

In the embodiment of FIGS. 6(a) and 6(b), like previous embodiments, a semiconductor chip 1 can be mounted to the surface of a bottom portion 11 of a metal base 10A. A semiconductor chip 1 can be essentially identical to that of the first embodiment, with a drain electrode 4 on a bottom surface of semiconductor chip 1 being mounted to a metal base 10A with a die bond material. A surface of semiconductor chip 1 can have a gate electrode 7 and a source electrode 8. Once a semiconductor chip 1 is mounted, a surface level of drain connection electrodes 15A can be higher than that of gate electrode 7 and source electrode 8. Such a difference in height can be about 0 to 0.1 mm, preferably about 0.3 mm.

Like the first embodiment, in a semiconductor device of FIGS. 6(a) and 6(b), a metal base 10A can have a slightly larger surface area than a semiconductor chip 1, and an overall thickness of such a device can be the sum of the thickness of the of the semiconductor chip 1 and the metal base 10A. Moreover, there is no need to bond a metal wire, or the like, to a semiconductor chip 1, and the device does not have to be sealed in resin.

In this way, a second embodiment can provide a semiconductor device that can be reduced in size and thickness, and when mounted, can exhibit advantageous heat dissipating capability because metal base 10A can function as a heat sink.

When a semiconductor device like that of FIGS. 6(a) and 6(b) is mounted to a mounting substrate 30, like that shown in FIG. 5, drain connection electrodes 15A can be easily soldered, as their area can be smaller than that of a gate electrode 7 and source electrode 8. Such a smaller area can translate into lower heat capacity during a solder reflow. A smaller area for drain connection electrodes 15A can result from making sides of the square shape far shorter than an overall length of a metal base 10A.

In one particular arrangement, one side of the square of a drain connection electrode 15A can be the length of a square inscribed within a circle of gate electrode 7 and source electrode 8. Further, corresponding to such an arrangement, a mounting substrate can include drain connection electrode pads (shown differently as 35 in FIG. 5) having the same essential dimensions as a gate electrode pad portion 33 and a source electrode pad portion 34. Therefore, drain connection electrodes 15A can be contained within corresponding pad portions in most cases.

It is also noted that while an area of drain connection electrodes 15A can be made smaller than that of a gate electrode 7 and source electrode 8, a lower portion of drain connection electrodes 15A can be integral to a corresponding side portion 12, which can run along an entire length of a metal base 10A. As a result, a mechanical strength of a drain connection electrode 15A can be enhanced.

Furthermore, because a surface of drain connection electrodes 15A can be higher at a higher level than gate electrode 7 and source electrode 8, mechanical damage to a semiconductor chip 1 that might otherwise occur in a mounting operation can be prevented. In addition, soldering reliability of gate electrode 7 and source electrode 8 are suitable improved.

The embodiment of FIGS. 6(a) and 6(b) can be formed by metal plate processing similar to that previously described, yet resulting drain connection electrodes 15A can have a larger area than those of the previously described embodiments. Thus, this embodiment may be less advantageous will respect to reducing heat capacity of such drain connection electrodes. However, such an approach can result in a larger contact area between drain connection electrodes 15A and a corresponding pad portion (e.g., 35) of a mounting substrate 30. Thus, this embodiment may have an advantageously lower drain connection resistance.

In this way, a mounting reliability in drain connection electrodes can be improved substantially over other conventional semiconductor device approaches.

Figure 7:
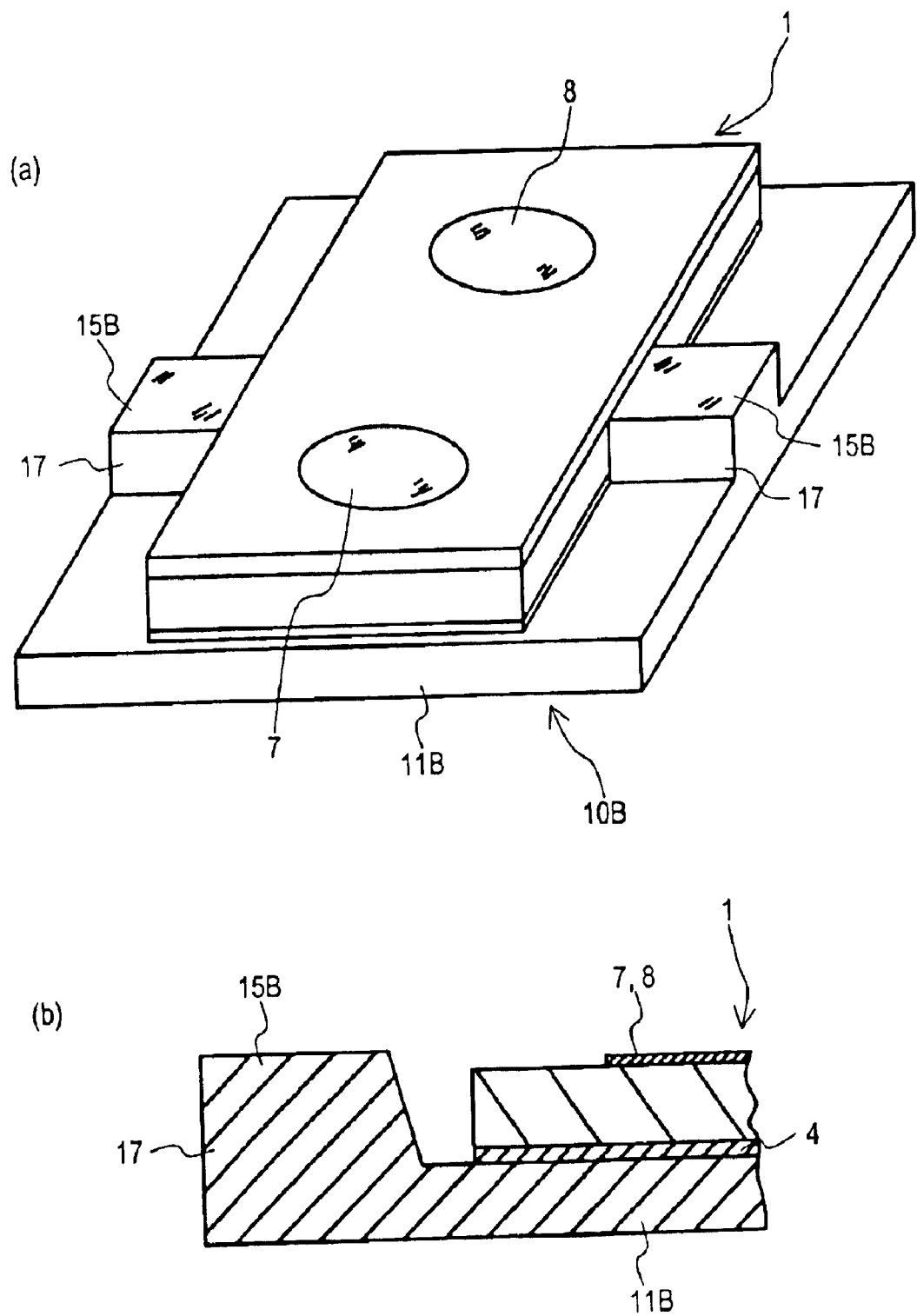
FIGS. 7(a) and 7(b) are a perspective and enlarged side cross sectional views, respectively, of a semiconductor device according to a third embodiment of the present invention.

FIG. 7(a) is a perspective view of a semiconductor device according to a third embodiment. FIG. 7(b) is an enlarged partial cross section of the semiconductor device of FIG. 7(a). While a metal base of a semiconductor device of FIGS. 6(a) and 6(b) can be formed by bending, a metal base 10B in this arrangement can be formed by etching or forging.

A metal base 10B can be rectangular and can be a little wider than a semiconductor chip 1. A metal base 10B can have a bottom portion 11B. A rectangular mesa-like convex portion 17 can be formed on a surface of each side of a bottom portion 11B. A convex portion 17 can serve as a drain connection electrode 15B. Like a drain connection electrode 15A of a second embodiment, a drain connection electrode 15B can be positioned in the center, with respect to a longitudinal direction, of a bottom portion 11B. A drain connection electrode 15B can have substantially the same are as a drain connection electrode 15A. However, when viewed in cross section, can have a trapezoidal shape, so that the area of a lower part is a little larger than that of an upper part.

With a semiconductor chip 1 mounted, a surface level of drain connection electrode 15B can be higher than a gate electrode 7 and source electrode 8 of a semiconductor chip 1 by about 0 to 0.1 mm, preferably about 0.03 mm.

A semiconductor device according to the embodiment of FIGS. 7(a) and 7(b) can have the same thickness as the other embodiments, and therefore provides a reduced thickness as compared to conventional approaches. In addition, such a semiconductor device can be reduced in size as a bottom portion 11B of a metal base 10B can have substantially the same area as the above other embodiments. Furthermore, a metal base 10B can function as a heat sink to give this semiconductor device an advantageous heat dissipating capability.

A semiconductor device according to the embodiment of FIGS. 7(a) and 7(b) can be mounted to a mounting substrate in a manner similar to the first and second embodiments. A drain connection electrode 15B can be integral to a bottom portion 11B of a metal base 10B, thus making its heat capacity greater than that of gate electrode 7 and source electrode 8. However, a drain connection electrode 15B heat capacity can remain somewhat reduced, as its area can be less than that of a gate electrode 7 and source electrode 8, and it can have a trapezoidal cross sectional shape. Accordingly, any difference in the amount of solder needed for drain connection electrodes 15B versus gate electrode 7 and source electrode 8, can be limited. Thus, the amount of solder needed can be evened out among the drain connection electrodes 15B, gate electrode 7, and source electrode 8.

In addition, in the embodiment of FIGS. 7(a) and 7(b), because a surface of drain connection electrodes 15B can be higher than a gate electrode 7 and source electrode 8, mechanical damage to a semiconductor chip 1 that could occur during a mounting operation can be prevented, and the reliability of a soldering of a gate electrode 7 and source electrode 8 can be improved.

Still further, in the embodiment of FIGS. 7(a) and 7(b), a drain connection electrode 15B can be trapezoidal in cross section, with a lower part that can be integral to a bottom portion 11B of metal base 10B. This can provide substantial mechanical strength to the drain connection electrodes 15B. This too, can help to improve mounting reliability.

In the above embodiments, a semiconductor device can be mounted to a mounting substrate by forming solder balls, solder bumps or the like, on a gate electrode, source electrode, and drain connection electrodes. The use of solder balls can reduce mounting failures, as solder balls can be easier to use than pad-like electrodes. In addition, the height of solder balls can create a distance from a mounting substrate surface, resulting in less flux components adhering to a surface of a semiconductor chip during a mounting operation. Thus, decreases in reliability arising from flux related corrosion can be prevented.

Figure 8:
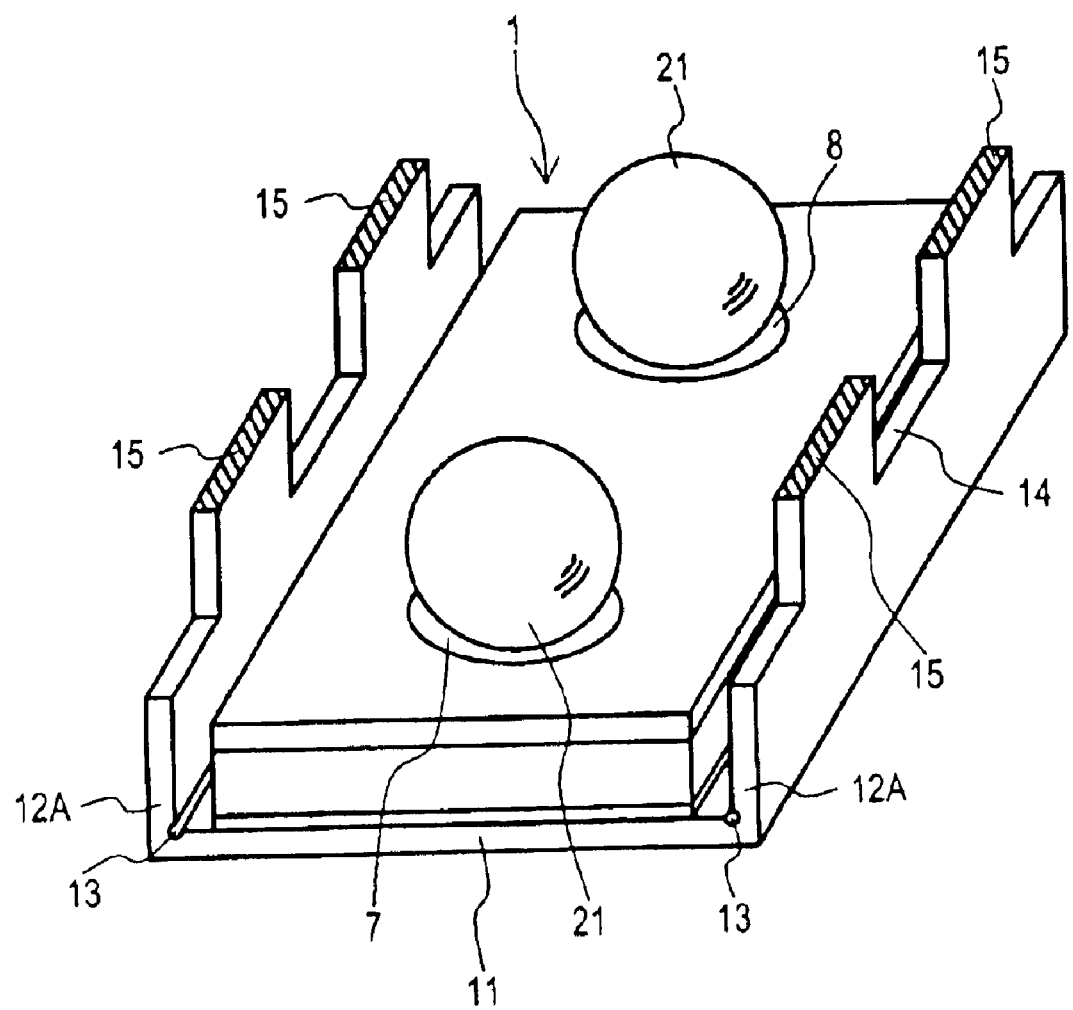
FIG. 8 is a perspective view of a semiconductor device according to a modified example of the first embodiment.

One example of a solder ball arrangement for a semiconductor device D, like that of the first embodiment, is shown in FIG. 8. In FIG. 8, solder balls 21 can be formed on a gate electrode 7 and source electrode 8. In such an arrangement, a semiconductor device D can be formed with side portions 12A on both sides of metal base 10 that are increased in height. Thus, drain connection electrodes 15 can be slightly taller than as solder balls 21 above the surface of gate electrodes 7 and source electrodes 8. As a result, drain electrodes 15 can be at a level of about 0.03 mm higher than a level of solder balls 21. In this way, the above advantages of solder ball mounting can be obtained by utilizing solder balls 21 and drain connection electrodes 15 to mount a semiconductor device to a mounting substrate.

Figure 9:
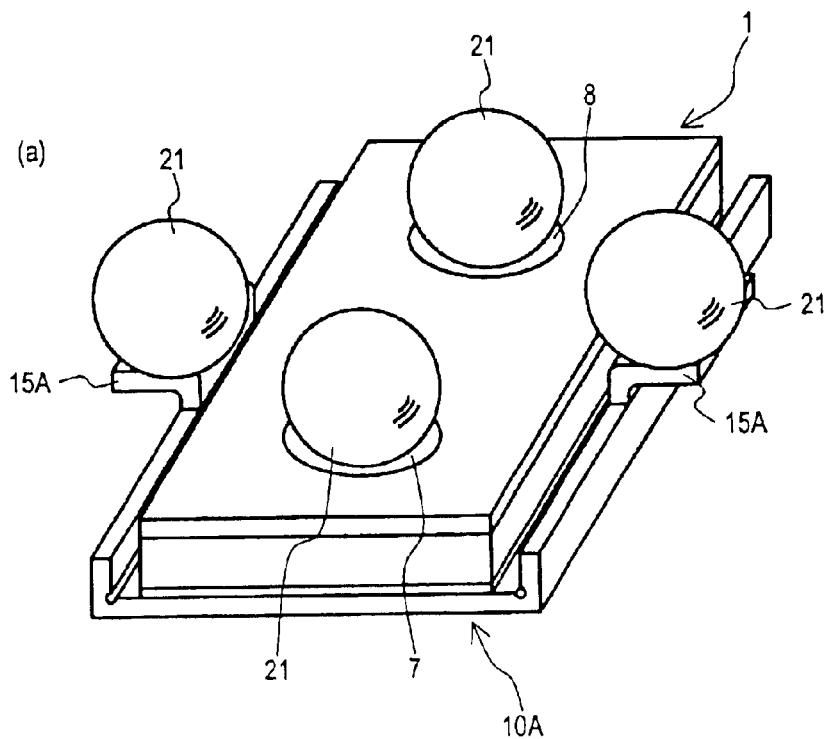
FIGS. 9(a) and 9(b) are perspective views of a semiconductor device according to modified examples of a second and third embodiment, respectively.
Figure 9:
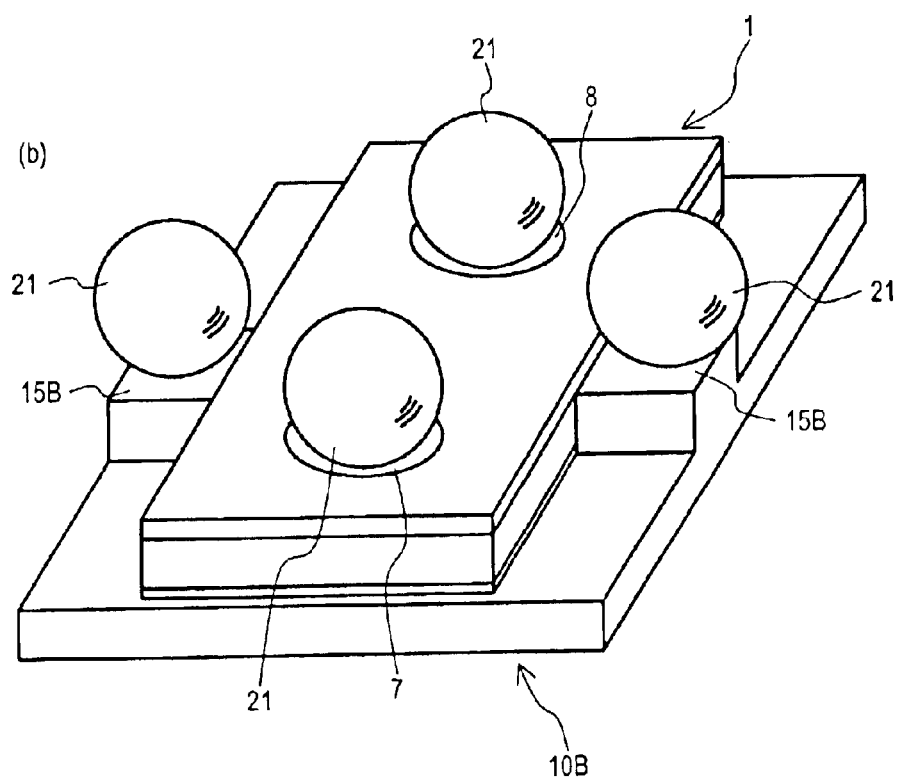

One example of a solder ball arrangement for a semiconductor device like that of the second embodiment is shown in FIG. 9(a). FIG. 9(b) shows an example of applying solder balls to a third embodiment. In FIGS. 9(a) and 9(b), solder balls 21 can be formed on electrodes 7, 8, 15A, and 15B. The corresponding semiconductor device can then be mounted to a mounting substrate by a hot press-fit utilizing such solder balls.

In both embodiments of FIGS. 9(a) and 9(b), a surface level of solder balls 21 on drain connection electrodes 15A and 15B can be higher than a surface level of solder balls 21 of gate electrodes 7 and source electrodes 8. Such arrangements can be maintained even if die thickness varies, as shown by the following examples.

Figure 10:
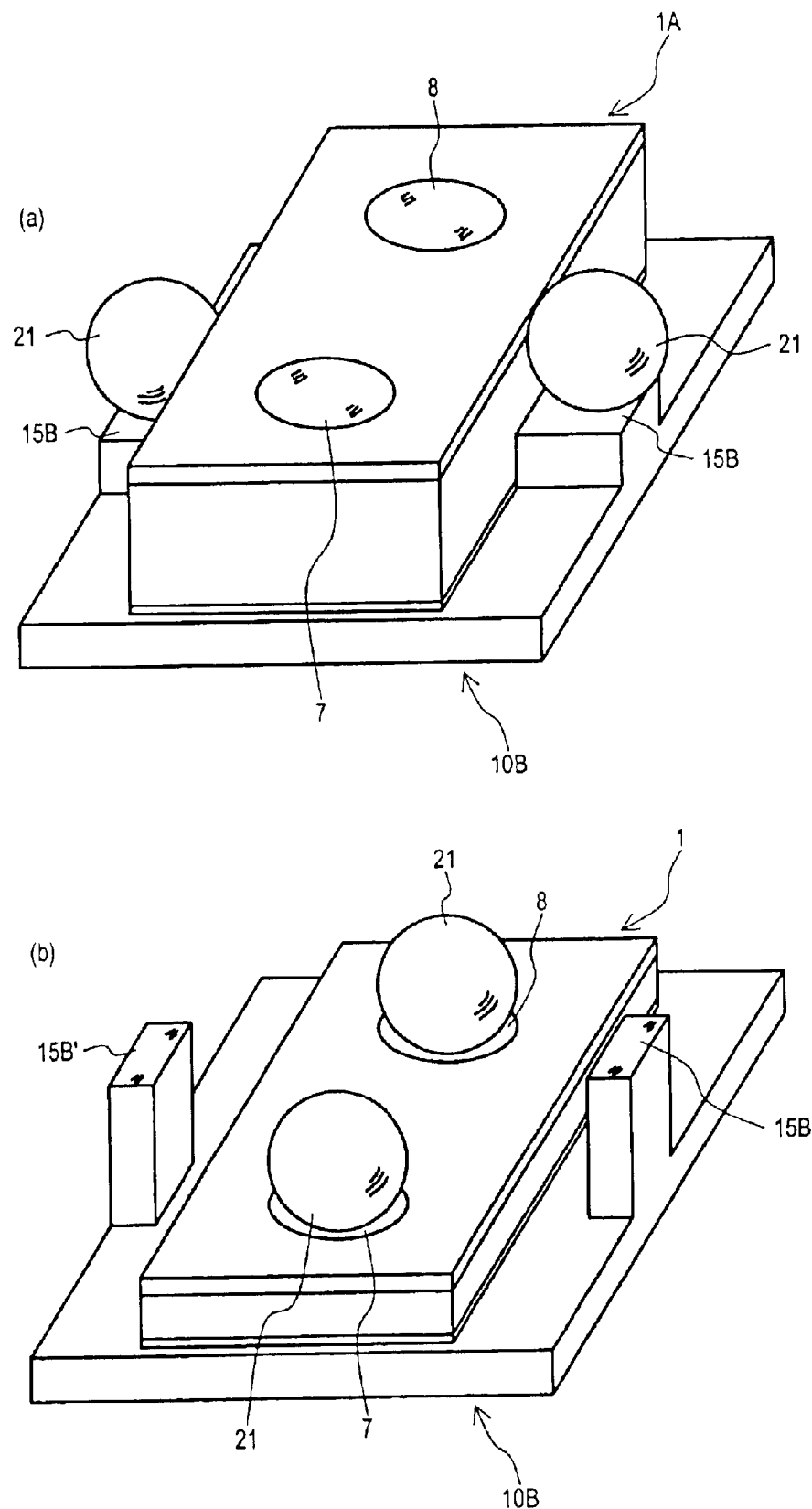
FIGS. 10(a) and 10(b) are perspective views of a semiconductor device according to other modified examples of a third embodiment, respectively.

Referring now to FIG. 10(a), if a relatively thick semiconductor chip 1A is mounted to a metal base 10B like that of a third embodiment, there can be a substantial difference in the surface level of a gate electrode 7 and source electrode 8 with respect to drain connection electrodes 15B. However, solder balls 21 can be formed on drain connection electrodes 15B having a diameter that corresponds to such a difference in surface level. This can make is possible to mount such a semiconductor device face down on a mounting substrate.

Conversely, as shown in FIG. 10(b), if a height of drain connection electrodes 15B' is substantially greater than a thickness of a semiconductor chip 1, solder balls 21 can be formed on a gate electrode 7 and source electrode 8 having a diameter that corresponds to the difference in surface level. In this case, solder balls 21 can be given a surface level that is different than drain connection electrodes 15B'.

Referring once again to FIG. 4, to mount solder balls according to the various teachings set forth above, a process can include a step S7. In a step S7, a solder ball mounting machine can be placed down stream of a mounting step S4 (or mounting machine). In particular, after a semiconductor chip 1 is mounted to a metal base 10, solder balls 21 are placed on predetermined electrodes by a solder ball mounting machine (step S7) and then subjected to a reflow step by a curing machine (step S5). In this way, solder balls can be mounted on electrodes of a semiconductor device. Solder bumps are also applicable in stead of solder balls.

Figure 11:
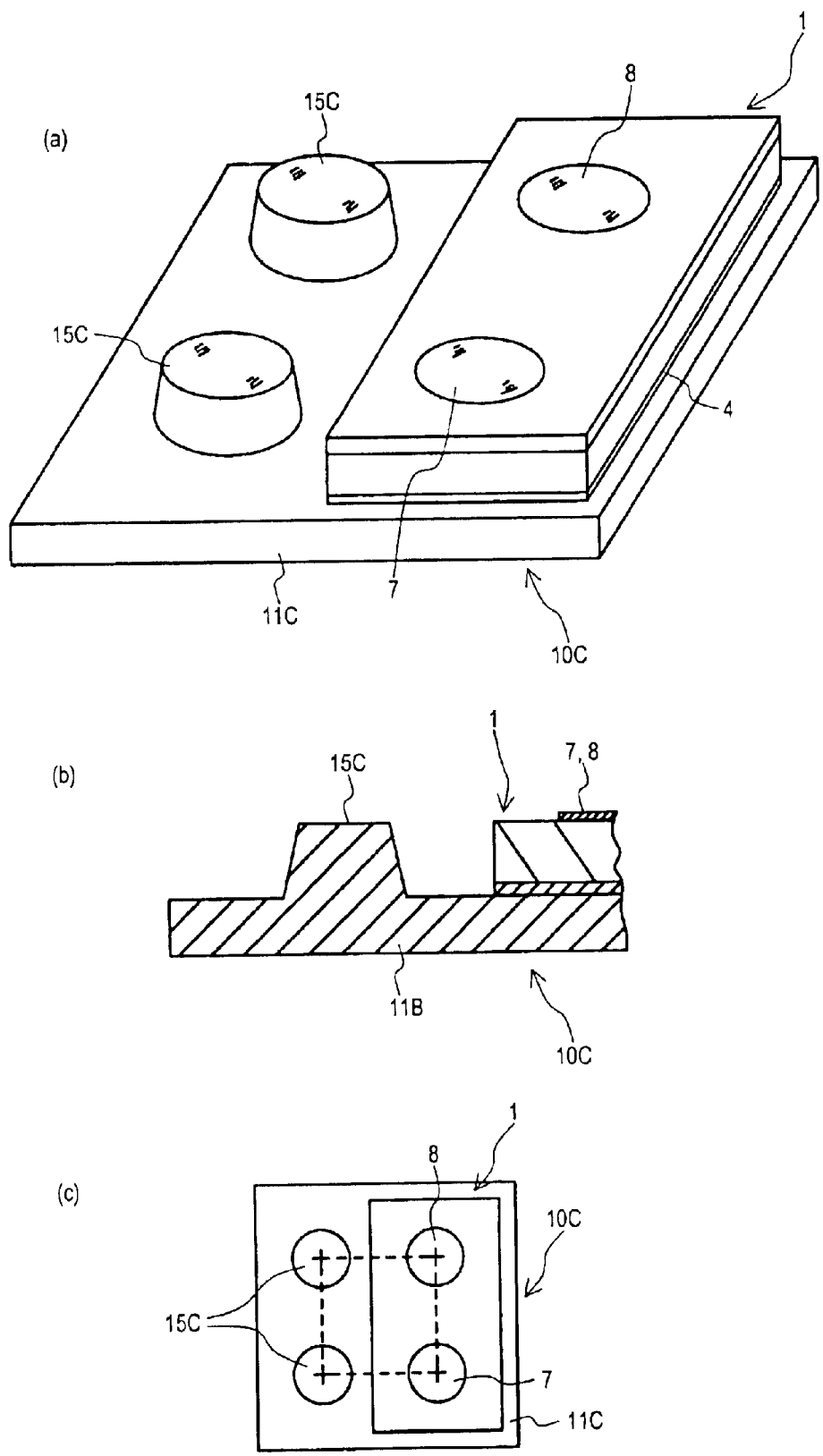
FIGS. 11(a), 11(b) and 11(c) are a perspective view, enlarged side cross sectional view, and plan view, respectively, of a semiconductor device according to a fourth embodiment of the present invention.
Figure 12:
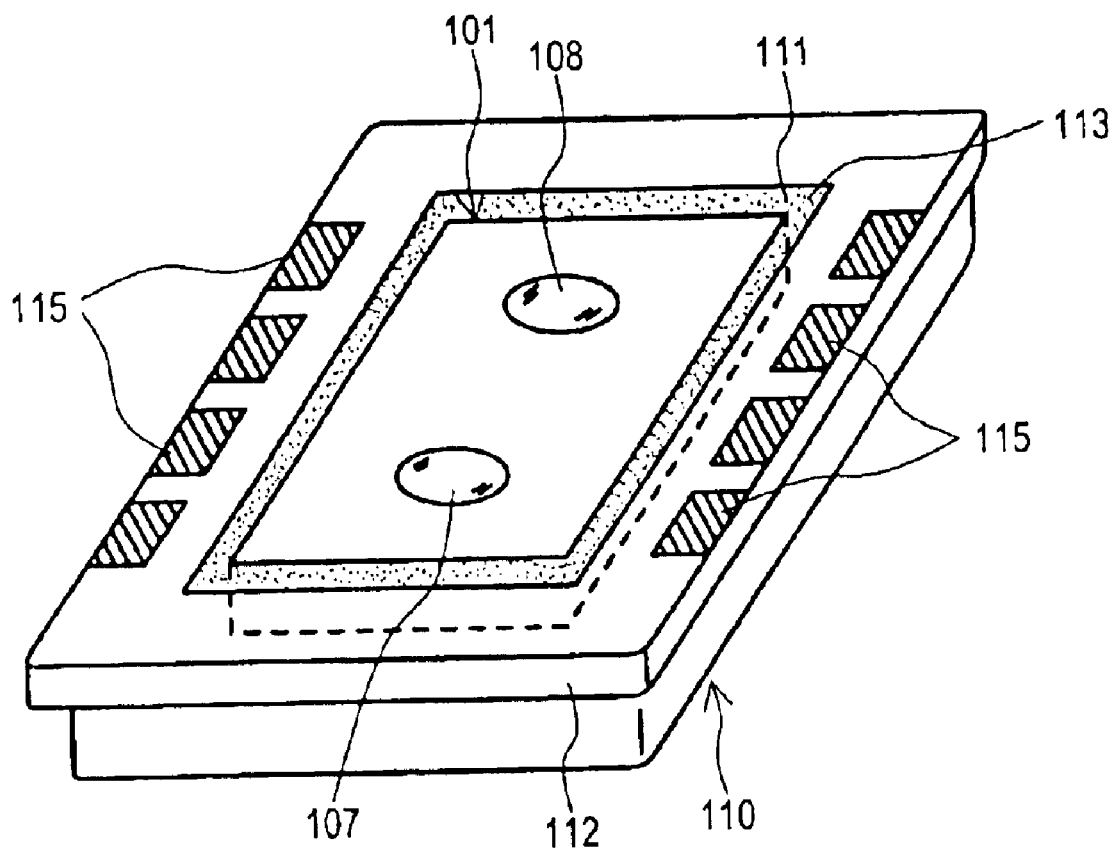
FIG. 12 is a perspective view of one example of a conventional semiconductor device.
Figure 13:
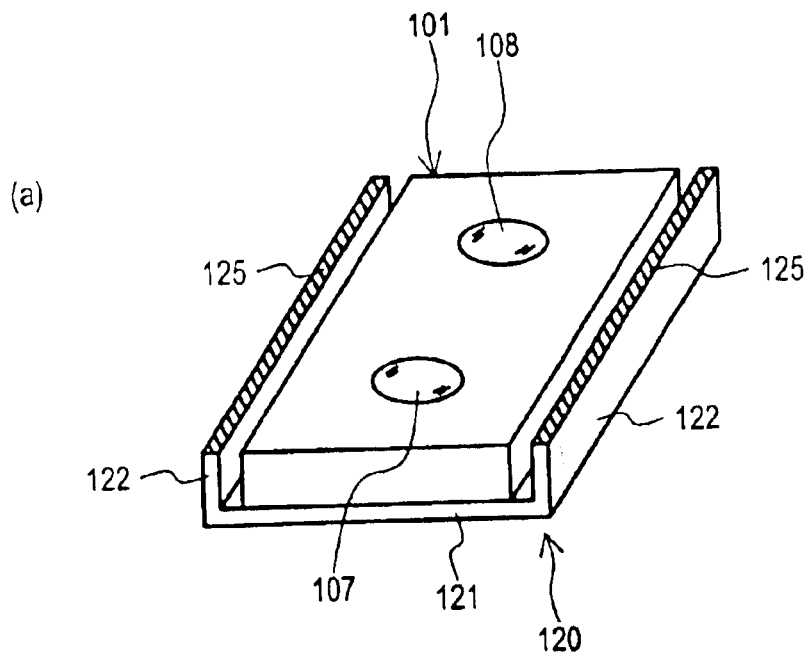
FIGS. 13(a) and 13(b) are perspective views of other examples of conventional semiconductor devices.
Figure 13:
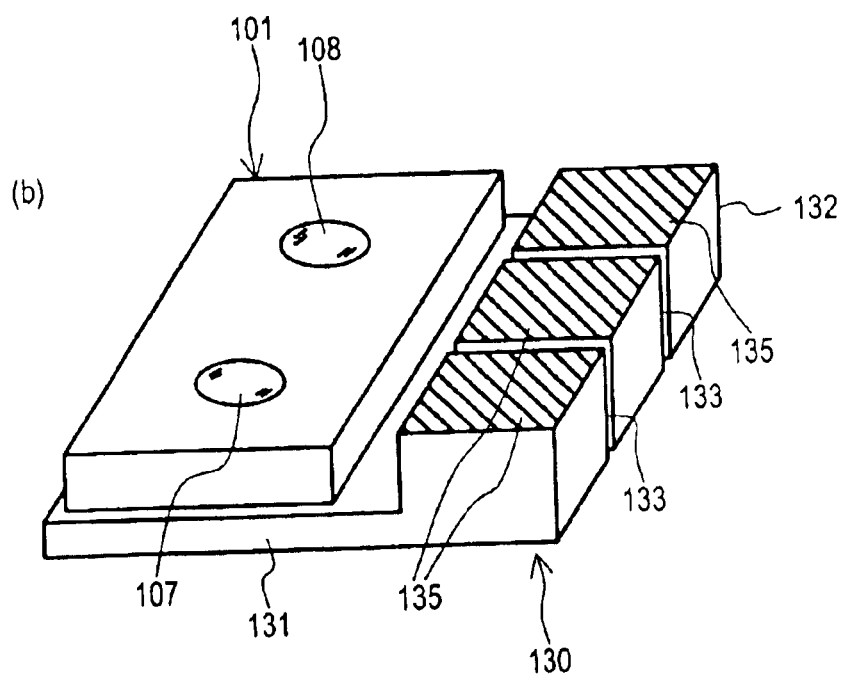
Figure 14:
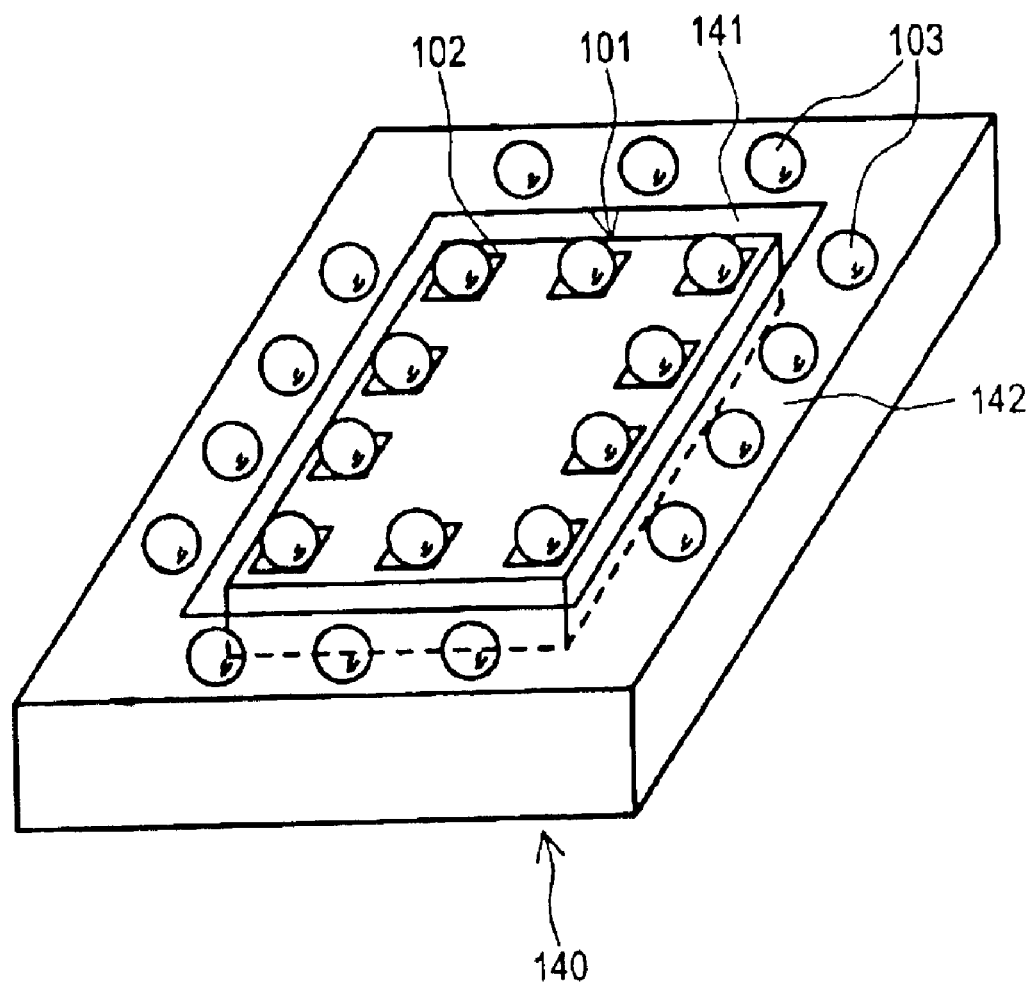
FIG. 14 is a perspective view of yet another example of a conventional semiconductor device.

FIG. 11(a) is a perspective view of a semiconductor device according to a fourth embodiment of the present invention. FIG. 11(b) is an enlarged partial cross section of the semiconductor device of FIG. 11(a). Like the first embodiment, this embodiment shows the application of the present invention to a MOSFET. In this embodiment, a metal base 10C can be formed from a rectangular metal plate. Such a metal base 10C can have an area that is approximately twice the size of semiconductor chip 1.

As shown in FIG. 11(a), a semiconductor chip 1 can be mounted in a region that is close to one side of a bottom portion 11C of metal base 10C. Two drain connection electrodes 15C can be integrally formed in region close to the other side of bottom portion 11C. A semiconductor chip 1 can be identical to a semiconductor chip 1 of a first embodiment. Thus, a semiconductor chip 1 can include a drain electrode 4 on a rear surface that is mounted to the surface of bottom portion 11C with a die bond material, or the like. Further, a semiconductor chip 1 can include a front surface that includes circular gate electrode 7 and source electrode 8.

As shown in FIGS. 11(a) and 11(b), drain connection electrodes 15C formed on one side of a bottom portion 11C of a metal base 10C can have a circular, mesa-like shape. In one approach, drain connection electrodes 15C can be formed by etching of forging a metal plate that constitutes metal base 10C. A circular mesa-like shape can have a diameter slightly smaller than that of circular gate electrode 7 and/or source electrode 8. Further, a diameter of drain connection electrodes 15C can be a little bit larger in a lower region than an upper region to provide a trapezoidal shape when viewed in cross section (e.g., FIG. 11(b)).

Referring now to FIG. 11(c), two drain connection electrodes 15C can be symmetrically arranged with respect to edges of a bottom portion 11C of metal base 10C. More particularly, a distance from drain connection electrodes 15C to a left side edge (when viewing FIG. 11(c)) can be essentially the same as the distance of an upper drain connection electrode 15C to top edge, and a distance of a lower drain connection electrode 15C to a lower edge.

In addition or alternatively, drain connection electrodes 15C can be symmetrical with respect to gate electrode 7 and source electrode 8. For example, as shown by dashed lines in FIG. 11(c), a center of gate electrode 7, a center of source electrode 8, and the centers of drain electrodes 15C can from a square. Further, such a square can be concentric with respect to metal base 10C.

In the particular embodiment of FIGS. 11(a) and 11(b), drain connection electrodes 15C can have a surface level essentially equal to that of a gate electrode 7 and a source electrode 8. That is, a surface level difference between such electrodes can be essentially 0 mm.

A semiconductor device of the embodiments of FIG. 11(a), 11(b) or 11(c) can have essentially the same thickness as the above described first through third embodiments. Therefore, such a device can provide advantageously reduced thickness as compared to some conventional devices. However, the embodiments of FIG. 11(a), 11(b) or 11(c) can have a larger area than other embodiments, as a metal base 10C can be essentially twice the size of a semiconductor chip 1 (as opposed to essentially the same size in the other embodiments). However, such a larger size metal base 10C can serve as a larger heat sink once the device is mounted. Thus, a fourth embodiment may provide enhanced heat dissipation characteristics.

When mounting a semiconductor device FIG. 11(a), 11(b) or 11(c) to a mounting substrate, all electrodes can be soldered under almost identical conditions. This is because drain connection electrodes 15C can be circular like a gate electrode 7 and a source electrode 8 of semiconductor chip 1. Even though drain connection electrodes 15C are integral to a metal base 10C, and thus can present a larger heat capacity than a gate electrode 7 and a source electrode 8, a diameter of drain connection electrodes 15C can be slightly smaller than a gate electrode 7 and a source electrode 8, and can be trapezoidal in cross section. As a result, the amount of solder needed for mounting can be more even among the electrodes, and the need for disadvantageously high temperatures can be eliminated. Thus, the reliability of a soldering connection for drain connection electrodes 15C and/or gate electrode 7 and source electrode 8 can be improved.

Still further, in the event drain connection electrodes are equidistant from the sides of a metal base 10C, drain connection electrodes 15C have the same heat capacity. As a result, a heat capacity balance in a circumferential direction around the drain connection electrodes 15C can be essentially uniform. This can be effective in improving the uniformity of solder reflow for drain connection electrodes 15C.

Still further, because drain connection electrodes 15C are situated in a region within metal base 10C, solder can be prevented from running up side walls of a metal base 10C in a mounting operation.

Even further, when drain connection electrodes 15C, a gate electrode 7 and a source electrode 8 are symmetrically arranged, stability of a metal base 10C during a mounting operation can be enhanced. This can equalize soldering conditions among the electrodes, further improving the solder connections for such electrodes.

It is additionally noted that because a surface level of drain connection electrodes 15C, a gate electrode 7 and a source electrode 8 can be essentially equal, a semiconductor device will be placed on a mounting substrate in a stable fashion during soldering operation. Along these same lines, drain connection electrodes 15 that are integral to a metal base can provide connections with advantageous mechanical strength. This too can improve mounting reliability.

In a fourth embodiment, like that shown in FIGS. 11(a) and 11(b), solder balls can be formed on drain connection electrodes 15C, a gate electrode 7 and a source electrode 8 (although an illustration of such an arrangement is not included).

Further, while drain connection electrodes of a third and fourth embodiment have been shown with trapezoidal shapes in cross section, such electrodes may have other shapes, such as prism-like or cylindrical, as but two examples. However, in such arrangements, drain connection electrodes are integral to a metal base, and no groove is allowed between the drain connection electrodes and the metal base, in order to provide a continuous structure.

Still further, while particular examples of a fourth embodiment have shown drain connection electrodes 15C, a gate electrode 7, and a source electrode 8 arranged in to a square, other embodiments may have different arrangements. As but one example, similar operational effects can be obtained by arranging such electrodes in some other grid pattern.

The first through third embodiments have shown examples in which a drain connection electrode can be taller than gate electrode and source electrode by a predetermined amount. However, this characteristic should not be construed as limited to only the disclosed embodiments. According to the present invention, such a feature can be applied to different, otherwise known semiconductor devices, to thereby prevent mechanical damage and/or improve soldering reliability to drain connection electrodes or other electrodes.

It is understood that if etching is employed to form a metal base, like those of the third and fourth embodiments, such a method may not be as advantageous as other embodiments that utilize bending. Nevertheless, such etching approaches are relatively easy to realize as a metal plate need only be etched in a thickness direction, and drain connection electrodes can be relatively simple shapes. Needless to say, if forging is employed, such a manufacturing step can be as easy to employ as bending.

The above embodiments have illustrated examples of a semiconductor device applied to a MOSFET semiconductor chip. However, the present invention could be applied to other types of devices, including but not limited to a bipolar transistor, a diode, an integrated circuit (IC), or the like.

As has been described, according to the present invention, connection electrodes a device can be set at a higher level than a gate electrode and source electrode of a semiconductor chip. Therefore, mechanical damage to a semiconductor chip, that could otherwise occur when the device is mounted face down, can be avoided. Further, such a resulting difference in height between electrodes of a semiconductor chip and a mounting substrate can increase the reliability of a solder connection to such electrodes.

According to the present invention, a semiconductor device can include a metal base with a bottom portion and side portions formed by bending. Connection electrodes can be formed by selectively cutting off upper edges of the side portions. Accordingly, the area of such connection electrodes can be made smaller than electrodes of a semiconductor chip by shortening the length of such connection electrodes. This can reduce the heating capacity of the connection electrodes, even out the amount of solder among the electrodes, and raise the soldering reliability for such electrodes. At the same time, thermal damage to a semiconductor chip can be avoided.

Still further, lower parts of connection electrodes can be integral to a metal base to ensure mechanical strength. Furthermore, a symmetrical arrangement of connection electrodes can make it possible to place a metal base onto a mounting substrate in a stable fashion during a soldering operation. This can improve soldering reliability.

According to the present invention, connection electrodes can be formed by bending remaining upper edges of side portions of a metal base outward. Such connection electrodes can have a smaller area than electrodes on a corresponding semiconductor chip. Therefore, despite the fact that connection electrodes are formed by processing a metal plate, because such electrodes are bent outward, connection electrodes for a mounting substrate can provide a relatively large and low resistance connection.

According to the present invention, a metal plate can include connection electrodes formed by areas of partially increased thickness in a bottom portion thereof. An area of such connection electrodes can be smaller than the area of electrodes on a corresponding semiconductor chip. Therefore, a heat capacity of such connection electrodes can be reduced, and the amount of solder can be evened out among the electrodes. Connection electrodes can be trapezoidal in shape when viewed in cross section, with a lower part having a larger area than an upper part. This can enhance mechanical strength of such connections, and can raise the reliability of soldering connections to such electrodes to a mounting substrate. If surfaces of connection electrodes are set higher than surfaces of a semiconductor chip electrodes, mechanical damage to a semiconductor chip in a mounting operation can be prevented, and the soldering reliability for such connections can be improved.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:

a metal base having a bottom portion formed from a metal plate and at least two side portions situated upward from the bottom portion, the at least two side portions having notches therein to form upper and lower edges in the side portions, the upper edges being connection electrodes for mounting the semiconductor device to a mounting surface; and a semiconductor chip mounted to the bottom portion of the metal base having a surface with surface electrodes for mounting the semiconductor device to the mounting surface.

2. The semiconductor device of claim 1, wherein:

each of the connection electrodes has an area that is less than any of the surface electrodes.

3. The semiconductor device of claim 1, wherein:

the connection electrodes are symmetrical about a first axis that is parallel to the side portions, and symmetrical about a second axis that is perpendicular to the first axis.

4. The semiconductor device of claim 1, wherein:

the metal base includes grooves along a border between the bottom portion and each side portion.

5. The semiconductor device of claim 1, wherein:

the surface electrodes of the semiconductor chip are at a first surface level; and the connection electrodes are at a second surface level higher than the first surface level by a predetermined distance that is greater than 0 mm and less than or equal to 0.1 mm.

6. The semiconductor device of claim 1, wherein:

solder balls or bumps are formed on the at least one of the connection electrodes and one of the surface electrodes.

7. The semiconductor device of claim 1, wherein:

the semiconductor chip is an insulated gate field effect transistor (IGFET) having a drain electrode formed on a rear surface in direct electrical contact with the bottom portion of the metal base so that the at least one connection electrode is a drain connection electrode, and the surface electrodes include a gate electrode and source electrode for the IGFET.

* * * * *